United States Patent [19]

Burt

[11] Patent Number: 5,881,200

[45] Date of Patent: Mar. 9, 1999

[54] OPTICAL FIBRE WITH QUANTUM DOTS

[75] Inventor: Michael Graham Burt, Woodbridge, Great Britain

[73] Assignee: British Telecommunications public limited company, London, England

[21] Appl. No.: 809,179

[22] PCT Filed: Sep. 29, 1995

[86] PCT No.: PCT/GB95/02322

§ 371 Date: Mar. 20, 1997

§ 102(e) Date: Mar. 20, 1997

[87] PCT Pub. No.: WO96/10282

PCT Pub. Date: Apr. 4, 1996

[30] Foreign Application Priority Data

Sep. 29, 1994 [EP] European Pat. Off. ............... 94307113

[51] Int. Cl.$^6$ ....................................................... G02B 6/20
[52] U.S. Cl. ............................ 385/142; 385/143; 385/125
[58] Field of Search ..................................... 385/123, 141, 385/142, 143, 125; 372/39

[56] References Cited

U.S. PATENT DOCUMENTS 5,260,957  11/1993  Hakimi et al. .............................. 372/39
5,452,123   9/1995  Asher et al. .............................. 359/296

FOREIGN PATENT DOCUMENTS

0328202 A3   8/1989  European Pat. Off. .
WO 93/08500  4/1993  WIPO .

OTHER PUBLICATIONS

Tauber et al, Optical Fiber Communication Conference '92 Technical Digest, vol. 5, 2 Feb. 1992, San Jose, US, p. 71. DATABASE WPI Section Ch, Week 9235, Derwent Publications Ltd., London GB, Class L01, AN 92–287166 & JP–A–04 195 028 (Furukawa Electric Co. Ltd.), 15 Jul. 1992.

Patent Abstracts of Japan, vol. 95, No. 1, 28 Feb. 1995 & JP A 06 301071 (Mitsui Toatsu Chem.) 28 Oct. 1994.

Mews et al., "Preparation, Characterization, and Photophysics of the Quantum Dot Quantum Well System DdS/HgS/CdS", Journal of Physical Chemistry, vol. 98, No. 3, 20 Jan. 1994, USA, pp. 934–941.

Rajh et al, "Syntheisis and Characterization of Surface–Modified Colloidal CdTe Quantum Dots", Journal of Physical Chemistry, vol. 97, No. 46, 1993, USA, pp. 11999–12003.

Schwerzel et al, "Nonlinear Optical Properties of Colloidal Quantum–cot Composite Materials with Tailored Organic Coatings", Proc. of the SPIE, vol. 1337, 1990, pp. 132–141 No month.

Ghatak, "The Termoelectric Power in Fiber Optic and Laser Materials Under Cross Field Configuration", Fiber Optic and Laser Sensors IX, Boston, MA, USA, 3–5 Sep. 1991, vol. 1584, ISSN 0277–786X, Proceedings of Optical Engineering, 1991, USA, pp. 435–447.

*Primary Examiner*—John D. Lee
*Assistant Examiner*—Ellen E. Kang
*Attorney, Agent, or Firm*—Nixon & Vanderhye P.C.

[57] ABSTRACT

An optical fiber includes a tubular glass cladding with a central opening filled with a colloidal solution of quantum dots in a support medium. The quantum dots may be caused to produce luminescence in response to input optical radiation, for example to produce optical amplification or laser radiation. A waveguide with an active medium comprising colloidal quantum dots is provided.

35 Claims, 1 Drawing Sheet

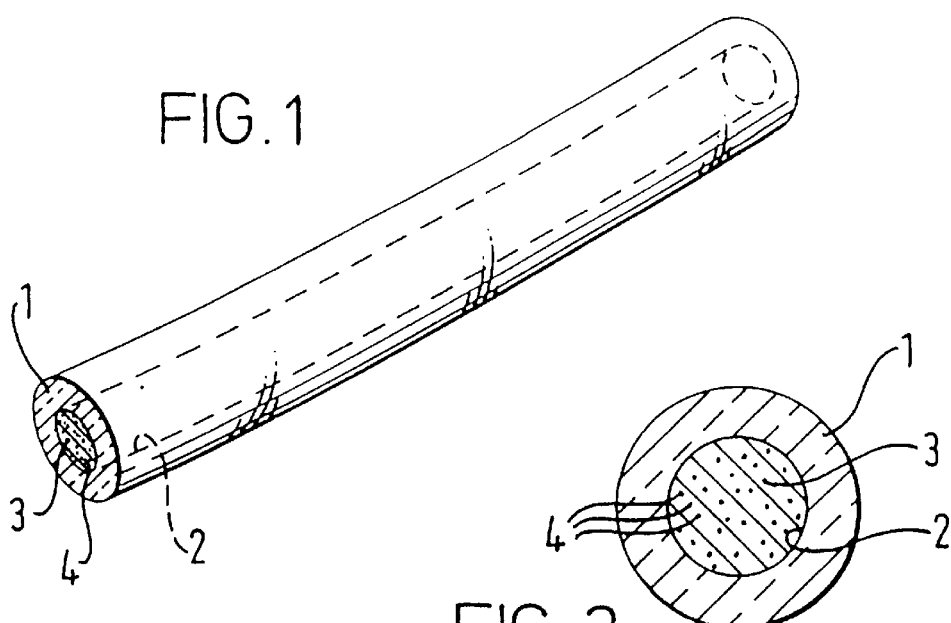
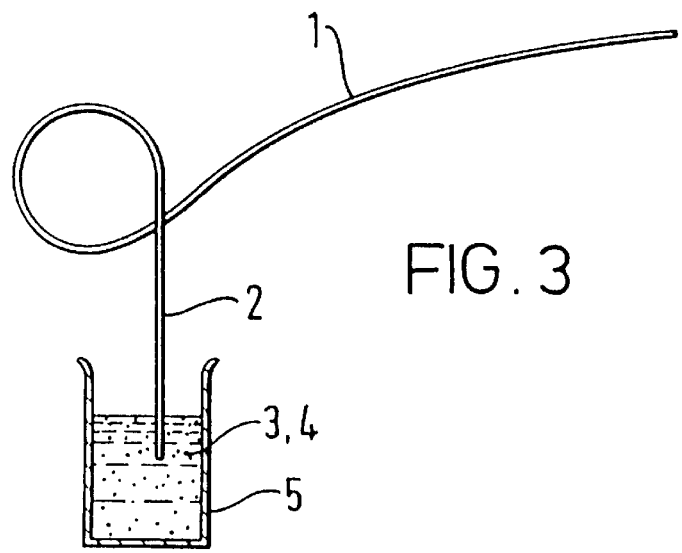
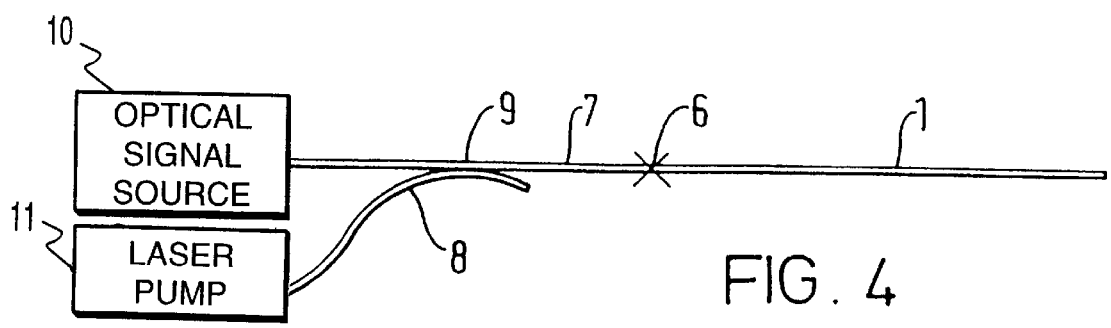

5,881,200

OPTICAL FIBRE WITH QUANTUM DOTS

BACKGROUND OF THE INVENTION

1. Field of the Invention

This invention relates to an optical fibre and has particular but not exclusive application to use as an optical amplifier.

2. Related Art

It is known that erbium doped fibres can be used as optical amplifiers. However, they suffer from a number of disadvantages. For example, a long length of fibre is required in order to achieve a significant level of amplification, e.g. 10 m. Also, erbium is a toxic substance so manufacture of the doped fibre is complex and requires strict pollution control measures.

Recently, it has been shown that very small particles, fabricated on the nanometre scale, give rise to specific optical effects, such as electroluminescence. A review is given in Colloidal Semi-conductor Q-Particles; Chemistry in the Transition Region Between Solid State and Molecules, M. Weller: Angew, Chem. Int. Ed. Engl. 1993, 32,41–53. These nanometre scale particles are known as quantum dots.

A laser making use of quantum dots is described in U.S. Pat. No. 5,260,957. In this arrangement, a host material such as PMMA contains quantum dots. The laser may be in the form of a channel waveguide device, the host material being arranged in a cavity formed in a channel machined in a substrate, the substrate having a lower refractive index than the host. The laser is pumped by an external light source in order to provide a laser output. The use of polymeric material is said to be advantageous.

An optical fibre with non-linear optical characteristics is known from JP-A-4-195028, in which the interior of a tubular glass sheath is coated with materials that, on subsequent heating, form particulate material disposed in a glass core of the fibre.

SUMMARY OF THE INVENTION

The present invention is concerned with the production of an optical fibre with improved amplification or wavelength conversion characteristics.

In accordance with the present invention, there is provided an optical fibre with a colloid of quantum dots therein.

The fibre may include a core and a cladding, with the colloid of quantum dots forming at least part of the core.

The colloid of quantum dots may include a non-vitreous support medium in which the dots are dispersed, e.g dichlorobenzene, toluene, benzene, nitrobenzene, pyridene or carbontetrachloride.

The dot density in the medium and the diameter distribution for the dots are selected depending on the application of the fibre. Similarly, the materials from which the dots are made are selected depending on the intended use. For example, when used as an optical amplifier, the quantum dots may comprise lead sulphide (PbS) with a diameter range of 5–10 nm.

The fibre according to the invention has particular application as an amplifier, when pumped by an external source, so that input light, e.g. light pulses, can be amplified. The arrangement may be similar to that used for a conventional erbium doped fibre, but with the advantage that the amplification is more efficient and so a much shorter length of fibre can be used. The fibre however has other uses, e.g. as a wavelength converter.

BRIEF DESCRIPTION OF THE DRAWINGS

In order that the invention may be more fully understood, an embodiment thereof and a method of making the same will now be described by way of example with reference to the accompanying drawings, in which:

FIG. 1 is a schematic perspective view of an optical fibre in accordance with the invention;

FIG. 2 is a transverse cross section of the fibre shown in FIG. 1;

FIG. 3 shows a method of making the fibre shown in FIG. 1; and

FIG. 4 illustrates the fibre, used in an optical amplifier.

DETAILED DESCRIPTION OF EXEMPLARY EMBODIMENTS

Referring to FIG. 1, this shows an example of optical fibre in accordance with the invention which consists of a tubular glass sheath 1 that has an elongated central opening 2 running the length thereof. Such a hollow fibre can be made and filled with a liquid in the manner demonstrated by Kashyap and Finlayson in Optics Letters 17 pp 405–407 (1992). The central opening 2 is filled with a colloid of quantum dots, namely a support medium 3 that contains quantum dots 4. This can be seen clearly from FIG. 2.

The colloid of quantum dots (3,4) forms the core of the fibre and the glass sheath 1 forms its cladding. The refractive index of the support medium 3 is selected to be somewhat greater than the refractive index of the glass sheath 1 so that the refractive index difference $\Delta n$ will cause light incident at one end of the fibre to be propagated along the length of the core, in a manner well known per se for optical fibres. Thus, light transmitted along the fibre is incident on the quantum dots 4 held in the support medium 3.

The quantum dots 4 are selected to produce photoluminescence. An appropriate selection is to use a material that luminesces efficiently in the bulk e.g. a direct gap semiconductor or insulator such as a III–V, II–VI or I–VII material or some alloy of these. However, other material should not be excluded, because selection rules that prevent a material luminescing efficiently in the bulk are relaxed to some extent in quantum dots. Also the surface treatment of the quantum dots may introduce new electronic transitions that may lead to efficient luminescence that is not related to the bulk electronic structure.

Suitable materials for the support medium are liquids with a refractive index larger than that for the glass of which the fibre is composed. Examples of such liquids are toluene, benzene and nitrobenzene.

As described by Weller, hitherto, much research has been carried out on colloidal samples for CdS, CdSe, PbSe and PbS, although reports on the synthesis of other particles include ZnS, ZnO, $TiO_2$, AgI, AgBr, $HgI_2$, ZnTe, CdTe, $In_2S_3$, $In_2Se_3$, $Cd_3P_2$, $Cd_3As_2$ and also GaAs. The sulphides, selenides, tellurides, and phosphides can be prepared by precipitation by $H_2S$, $H_2Se$, $H_2Te$ or $PH_3$ or their alkaline metal salts, from a solution containing the metal ion. Either $AsH_3$ or $As(CH_3)_3$ is used for the preparation of arsenides. The oxides are prepared, for example by the hydrolysis of the alkoxy compounds. Stable colloidal solutions are obtained by the addition of stabilisers (tensides, organic or inorganic polymers).

A much used method for the preparation of quantum dots is the precipitation in the presence of sodium polyphosphate as a stabiliser. The polyphosphate is well suited for the stabilisation of quantum dots, because the chain is strongly bound by metal ions to the particle surface. It causes electrostatic repulsion between particles because of its charge and also keeps them apart sterically because of its chain length. By means of the methods described by Weller it is possible to grow a colloidal solution containing for example CdSe particles of average diameter 1.3–2 nm.

A wide range of quantum dot diameters may be used. For example, quantum dots within a diameter range of 1–50 nm may produce useful results. Dots with a smaller diameter will produce more pronounced fluorescence so a range of 1–20 nm may be preferred.

As shown in FIG. 3, the colloidal solution may be caused to enter the tubular glass sheath 1 by capillary action. One end of the sheath 1 is inserted into a reservoir 5 containing the colloidal material 3, 4 which then fills the central opening 2 of the sheath by capillary action. If necessary, negative pressure can be applied to the other end of the sheath to aid the filling process. Positive pressure may be applied to the surface of the colloidal material in the reservoir 5.

FIG. 4 shows an example of the fibre according to the invention in an optical amplifier. One end of the fibre 1 is spliced at region 6 to a conventional silica optical fibre 7 which itself is fused to a further fibre 8 in a coupling region 9. Optical signals from a source 10 are directed into the fibre 1. Additionally, the fibre is pumped by, for example, a semiconductor laser 11, in order to promote an electron from one of the low energy states (normally occupied in the absence of the pump or signal beams) in the quantum dot into one of the high energy states (normally unoccupied in the absence of the pump or signal beams). The electron can then amplify a light signal from the source 10 by making a transition back from one of the high energy states to one of the low energy states and thereby emitting a photon, provided the energy lost by the electron in making the transition matches the energy of the photons in the signal beam.

The invention has the advantage that the amplification efficiency of the fibre, as shown in FIG. 4, is much greater than that of a conventional erbium doped fibre so that the length of fibre needed to achieve the appropriate amplification level is significantly reduced. Also, the power levels from the laser 11 may be reduced significantly. Furthermore, the materials used are less toxic which greatly simplifies manufacture.

A great advantage of a quantum dot amplifier is the ease with which it is possible to engineer the gain spectrum so that it is reasonably flat over the entire window of the fibre thereby allowing all wavelengths in a wave division multiplex transmission system to benefit equally from amplification. This can be achieved by ensuring that there is a suitable spread in the sizes of the quantum dots. If this cannot be done in one preparation, it can be achieved by mixing quantum dots from different preparations containing quantum dots of different mean sizes.

Whilst the arrangement of FIG. 4 produces amplification, it will be appreciated that by an appropriate choice of the quantum dots, wavelength conversion can also be achieved. In order to achieve this, the sources 10 and 11 may be selected to stimulate different wavelength transitions associated with the quantum dots. The source 10 may be modulated at a given bit rate, whereas the source 11 acts as a target wavelength, with the result that the optical radiation from the source 11 becomes modulated in the fibre at the bit rate of the source 10, thereby effecting wavelength conversion.

The manufacture of a specific example of an optical fibre for use as an amplifier will now be described.

EXAMPLE

A hollow preform of sodalime glass was drawn into an elongate sheath with an inner diameter of 5 $\mu$m for its central opening and an outer diameter of 125 $\mu$m, and cut to a length of 15 cm. The sheath had a refractive index of 1.45. The central opening was filled with a colloidal solution of quantum dots of PbS material with a mean diameter of 5–10 nm in a support medium of toluene. The filling was achieved by capillary action and negative pressure, as previously described. The ends of the central opening were left open, as the colloidal solution is held in place by capillary action. However, the ends can be filled with an optically transparent plugging material, if required. The mean concentration of the quantum dots in the support medium was approximately 1% by volume. The colloidal solution containing the quantum dots exhibited a refractive index of 1.50. The quantum dots exhibited band gaps over a range of 0.8–1.0 ev as a function of diameter, which permitted broadband lumiescence over a range 1.3–1.5 $\mu$m for light fed into the fibre, when pumped at a wavelength of 1.06 $\mu$m so as to provide broadband amplification in the two wavelength ranges often used for optical telecommunications.

The resulting fibre tends to support a single transmission mode, but if the diameter of the central opening is increased, multi-mode operation may be achieved.

The PbS quantum dots were formed by precipitation from an aqueous solution of a soluble lead salt e.g. $Pb(NO_3)_2$ or $Pb(OCOCH_3)_2$, using $H_2S$ as the precipitating agent, in the presence of sodium polyphosphate as a stabiliser. The resulting quantum dots were then dried so as to form a powder which was then dispersed in toluene in order to produce the colloidal solution to be used as the filler material for the glass sheath.

In order to aid luminescence, it is desirable to saturate the bonds which hang free at the surface of the quantum dots. This can be done by arresting the growth of the dots by adding $Pb(OH_2)$ so that the bonds which hang free are saturated with hydroxyl radicals. Alternatively, a so called "hard boiled egg" structure can be formed in which another semiconductor material coating is grown on the surface of the quantum dots. For example, for PbS dots, the yellow of the egg is PbS and the white may be a layer of CdS grown subsequently. Alternatively "eggs" with a yellow of PbSe and a white of CdSe can be formed. An example of this type of structure has been reported by A. Mews et al, Journal of Physical Chemistry (1994) 98, p934.

Other modifications fall within the scope of the invention. For example, the cladding material may not have its opening disposed centrally. Furthermore, the cladding may surround a solid core having a refractive index greater than that of the cladding, the core having an opening therein that receives the colloidal solution of quantum dots. This would reduce the restriction on the refractive index of the colloidal solution of quantum dots, and it may be possible to use a colloidal solution of quantum dots with a refractive index the same as or possibly a little lower than the refractive index of the cladding, with the refractive index of the core being higher than that of the cladding.

Also, the cladding may include more than one opening that receives the solution of quantum dots, e.g. in the manner of a multi-core optical fibre.

Whilst the colloid described in the examples comprises quantum dots dispersed in a liquid support medium, other states of support medium could be used, e.g. solids and gases.

In any or all of these constructions, the fibre may be formed from a non-silica glass such as a floride glass, or even a non-vitreous material such as a plastics material e.g. PMMA.

The optical amplifier described herein can be used in a resonant cavity to provide a laser. For example, the fibre as shown in FIG. 4 can be provided with semi-refractive surfaces at the splice 6 and at the free end, to provide a is Fabry-Perot resonant cavity. If desired, a pigtail fibre with refractive index grating may be attached to the free end of the fibre 1 to tune the cavity.

In another modification, the colloid of quantum dots may be used in a waveguide structure, which may itself be included in a resonant cavity e.g. to provide a laser, in which the waveguide is not a fibre defined by a cladding, but instead a channel formed in a substrate or some other non-fibre confirming structure.

As used herein, the term "optical" includes both visible and non-visible optical radiation, such as ultra violet and infrared.

What is claimed is:

1. An optical fibre with a light guiding region characterised by a colloid of quantum dots in a non-solid host therein.
2. An optical fibre as in claim 1 wherein the material of the quantum dots is a III–V, II–VI or I–VII material or an alloy thereof.
3. An optical fibre as in claim 1 wherein the material of the quantum dots is selected from CdS, CdSe, PbS, ZnS, ZnO, $TiO_2$, AgI, AgBr, $HgI_2$, PbSe, ZnTe, CdTe, $In_2S_3$, $In_2Se_3$, $Cd_3P_2$, $Cd_3As_2$ and GaAs.
4. An optical fibre as in claim 1 wherein the dots have a diameter range of 1–50 nm.
5. An optical fibre as in claim 1 wherein the dots have a diameter range of 1–20 nm.
6. An optical fibre as in claim 1 wherein the quantum dots have a diameter range of 1.3–2.0 nm.
7. An optical fibre as in claim 1 wherein the quantum dots have a diameter range of 5–10 nm and are formed of PbS material.
8. An optical fibre as in claim 1 wherein the colloid includes a non-vitreous support medium in which the dots are dispersed.
9. An optical fibre as in claim 8 wherein the support medium comprises an organic liquid.
10. An optical fibre as in claim 1 wherein the support medium is selected from dichlorobenzene, toulene, benzene, nitrobenzene, pyridene and carbon tetrachloride.
11. An optical fibre as in claim 1 wherein the quantum dots are formed from a first semiconductor material coated with a second different semiconductor material.
12. An optical fibre as in claim 1 incorporated in an optical amplifier.
13. An optical fibre as in claim 1 also including:
    pumping means for optically pumping the fibre, and input means for applying input signals to be amplified to the fibre.
14. An optical fibre as in claim 1 and operative as a wavelength converter.
15. An optical fibre as in claim 1 wherein:
    the fibre includes a core and a cladding, and the colloid of quantum dots forms at least a part of the core.
16. An optical fibre as in claim 15 wherein the cladding is made of glass.
17. A method of making an optical fibre as described in claim 16, said method including causing the colloid of quantum dots to enter the opening at least in part by capillary action.
18. A method as in claim 17, including applying negative pressure to one end of the fibre to assist in drawing the colloid therein.
19. An optical fibre as in claim 15 wherein the cladding is tubular and includes an opening filled with the colloid.
20. A method of making an optical fibre as described in claim 1 wherein said method includes formation of the quantum dots initially by precipitation from a salt solution.
21. A method as in claim 20 wherein the precipitated dots are dried and then dispersed in the support medium.
22. A waveguide that includes an optical active component that comprises a colloid of quantum dots in a non-solid host.
23. A waveguide as in claim 22 included in a laser resonant cavity.
24. A waveguide as in claim 22 including a channel in a substrate that contains said colloid of quantum dots.
25. An optical fibre characterized by a colloid of quantum dots in a non-solid host therein.
26. An optical fibre amplifier comprising:
    an optical fibre having a light-guiding region including a bore, and a cladding region surrounding the light-guiding region, the bore containing a colloid of quantum dots in a liquid host; and
    an optical pump source optically coupled to the optical fibre to provide optical pump radiation to produce a population inversion in said quantum dots so as to provide optical gain.
27. An optical fibre amplifier as in claim 26, wherein the quantum dots comprise a telluride material.
28. An optical fibre amplifier as in claim 27, wherein the quantum dots include cadmium.
29. An optical fibre amplifier as in claim 28, wherein the quantum dots have a diameter range of 5–10 nm.
30. An optical fibre amplifier as in claim 27, wherein the quantum dots have a diameter range of 5–10 nm.
31. An optical fibre amplifier comprising:
    an optical fibre having a longitudinally extending bore and a cladding region surrounding the bore, the bore containing a colloidal solution of quantum dots in an organic liquid, the quantum dots comprising a telluride material;
    an input port to receive optical signals to be amplified;
    an optical pump source optically coupled to the optical fibre to provide optical pump radiation to produce a population inversion in said quantum dots to provide optical gain; and
    an output port for the emission of said optical signals after amplification.
32. An optical amplifier as in claim 31 wherein the organic liquid comprises pyridene.
33. An optical fibre comprising:
    an elongated light-guiding cladding layer defining a light-guiding region therewithin; and
    said light-guiding region including a liquid colloid of quantum dots.
34. An optical amplifier comprising an optical fibre as in claim 33, said amplifier further comprising:
    an optical signal input port optically coupled to said liquid colloid at a first location in the fibre;
    an optical pump source optically coupled to said liquid colloid; and
    an amplified optical signal output port optically coupled to said liquid colloid at a second location in the fibre optically downstream from said input port.
35. A laser comprising an optical fibre as in claim 33 wherein:
    said optical fibre is included as part of a resonant optical cavity having optical feedback directed through said liquid colloid.

* * * * *